(12) United States Patent
Maneira

(10) Patent No.: US 10,875,336 B2
(45) Date of Patent: *Dec. 29, 2020

(54) PHOTOPOLYMERIC STAMP INDEXING IMAGES

(71) Applicant: CHEMENCE, INC., Alpharetta, GA (US)

(72) Inventor: John P. Maneira, Alpharetta, GA (US)

(73) Assignee: CHEMENCE, INC., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/514,106

(22) Filed: Jul. 17, 2019

(65) Prior Publication Data

US 2019/0337313 A1    Nov. 7, 2019

Related U.S. Application Data

(60) Continuation of application No. 16/183,337, filed on Nov. 7, 2018, now Pat. No. 10,384,481, which is a division of application No. 14/179,634, filed on Feb. 13, 2014, now abandoned, which is a continuation-in-part of application No. 13/902,301, filed on May 24, 2013, now abandoned.

(60) Provisional application No. 61/816,366, filed on Apr. 26, 2013.

(51) Int. Cl.
   *B41K 1/02* (2006.01)
   *B41K 1/36* (2006.01)
   *G03F 7/00* (2006.01)
   *G03F 7/20* (2006.01)

(52) U.S. Cl.
   CPC ............. *B41K 1/02* (2013.01); *B41K 1/363* (2013.01); *G03F 7/0015* (2013.01); *G03F 7/2032* (2013.01); *B41M 2205/14* (2013.01)

(58) Field of Classification Search
   None
   See application file for complete search history.

(56) References Cited

U.S. PATENT DOCUMENTS

| | | | |
|---|---|---|---|
| 9,023,591 B2 | 5/2015 | Battisti et al. | |
| 9,174,480 B2 | 11/2015 | Battisti et al. | |
| 9,310,687 B2 | 4/2016 | Maneira | |
| 9,703,198 B2 | 7/2017 | Maneira | |
| 9,726,971 B2 | 8/2017 | Maneira | |
| 10,384,481 B2* | 8/2019 | Maneira | G03F 7/0015 |
| 2006/0073417 A1* | 4/2006 | Hermesdorf | G03F 7/11 430/302 |
| 2010/0112484 A1* | 5/2010 | Kato | G03F 7/36 430/306 |

* cited by examiner

*Primary Examiner* — Joshua D Zimmerman
(74) *Attorney, Agent, or Firm* — Thomas|Horstemeyer, LLP

(57) ABSTRACT

An indexing image for craft stamps that is opaque to the eye but transparent to UV light is produced by printing a wavelength-specific solvent-based ink on the stamp substrate. This eliminates the step of printing a separate adhesive-backed indexing image sheet and applying it to the substrate.

25 Claims, 3 Drawing Sheets

PHOTOPOLYMERIC STAMP INDEXING IMAGES

CROSS-REFERENCES TO RELATED APPLICATIONS

This application is a continuation of U.S. application Ser. No. 16/183,337 filed Nov. 7, 2018, which is a divisional application of U.S. application Ser. No. 14/179,634 filed Feb. 13, 2014, which is a continuation-in-part application of U.S. application Ser. No. 13/902,301 filed May 24, 2013, which is a nonprovisional of U.S. Provisional Application Ser. No. 61/816,366 filed Apr. 26, 2013. Also pertinent to the present invention are U.S. patent application Ser. No. 14/027,760 filed Sep. 16, 2013 and U.S. patent application Ser. No. 14/176,110 filed Feb. 9, 2014. These applications are owned in common and have one inventor in common, and are Incorporated into the present application in their entirety.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

REFERENCE TO A BIOLOGICAL SEQUENCE LISTING

Not applicable.

BACKGROUND OF INVENTION

1. Field of the Invention

This invention is in the field of printing, more specifically in the field of manufacturing craft stamps, and still more specifically in the field of making craft stamp pads using photopolymer plates.

2. Description of the Related Art

Photopolymer craft stamps of a certain theme or style are typically imaged in photopolymer on a clear substrate using standard techniques—a UV-opaque mask image sheet being placed on top of the substrate and a UV-opaque relief image sheet below—and they are sold right on the substrate. An additional thermally-printed indexing image sheet is manually glued to the substrate so that the consumer can see what the stamp images will look like. The consumer peels a particular stamp off the substrate and sticks it to a clear acrylic block for use, then puts it back on the substrate when done.

BRIEF DESCRIPTION OF THE INVENTION

The present invention does away with the additional indexing image sheet by printing the indexing image in UV-transparent but optically opaque ink right on the substrate. Because it is UV transparent, this visible image does not interfere with development of the mask image in the photopolymer.

DETAILED DESCRIPTION OF THE INVENTION

Figure 1:
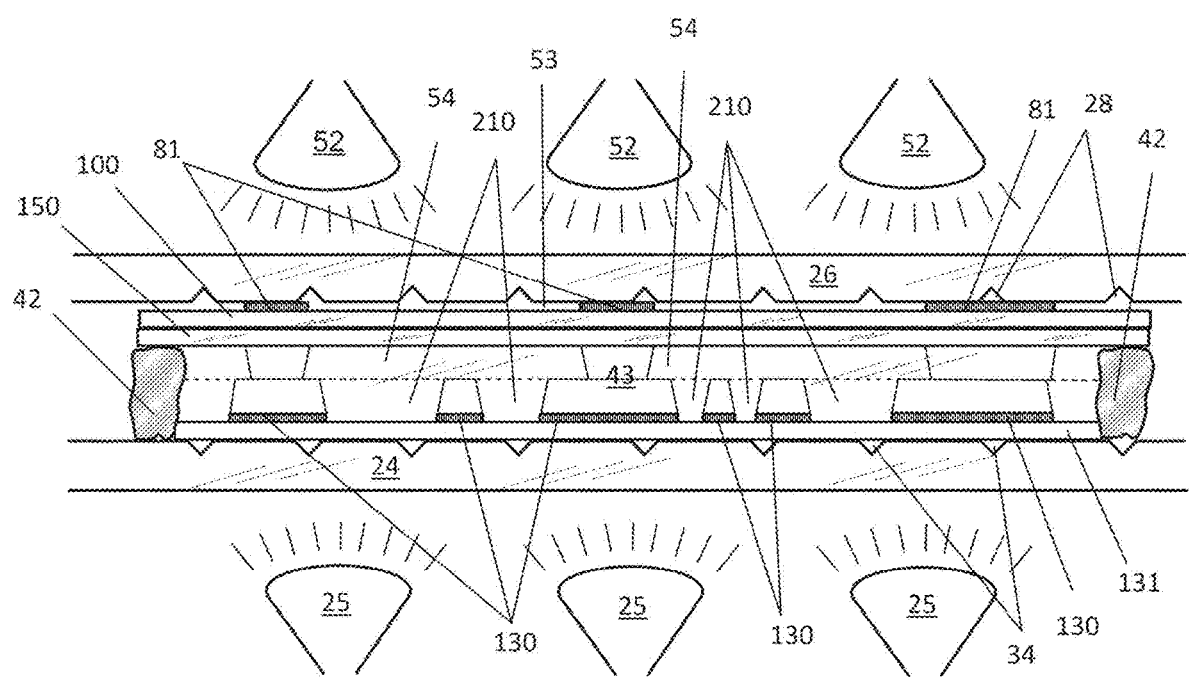
FIG. 1 is a cross-sectional illustration of a prior art method of using a liquid photopolymer to make a craft stamp I-plate.

A cluster of craft stamps of a certain theme or style are typically produced together on one sheet of substrate from a photopolymeric procedure. The stamps have a clear, thin backing sheet upon which an island plate (or "I-plate") has been developed. Each stamp is a relief image supported by a island image floor which acts as a webbing to hold together thin elements of the relief. Once developed, the duster of stamps are sold right on the substrate. Referring now to the drawings, which are not to scale, and in which like reference characters refer to like elements among the drawings, FIG. 1 is a cross-sectional illustration of a prior art method for making an l-plate suitable for a cluster of stamps. The steps involved are as follows:

(a) Print the stamp floor (masking) images 81 on a clear masking film 100;
(b) Print the stamp relief images 130 on a clear relief image film 131;
(c) Print the stamp images 101 on a clear indexing image sheet 102 (see FIG. 2);
(d) Apply a layer of adhesive (not visible in this view) to the underside of the Indexing image sheet 102:
(e) Place the relief image film 131 with the relief images 130 on the bottom glass 24 of the UV exposure unit (preferably, but not essentially, with the image side facing up);
(f) Optionally cover the relief image film 131 with a protective cover film (not shown);
(g) Optionally pull a vacuum in lower vacuum grooves 34 to remove air from under image film 131;
(h) Cast a layer of liquid photopolymer 43 adjacent to the relief image film 131 (employing dams 42 if necessary);
(i) Place a clear substrate 150 in contact with the upper surface of the liquid photopolymer layer 43;
(j) Place the printed masking film 100 on top of the clear substrate 150 (registering the mask image properly with respect to the relief image);
(k) Optionally pull a vacuum in upper vacuum grooves 25 to remove air from between upper glass 26, masking film 100, and substrate 150;
(l) Shine polymerizing light 52 through the masking film 100 for an amount of time suitable to form polymerized floor images 54 of a desired thickness in the liquid photopolymer;
(m) Shine polymerizing light 25 through the relief images 130 for an amount of time suitable to form polymerized relief images 210 in the liquid photopolymer between the polymerized floor images 54 and the relief images 130;

(n) (Not shown) Remove the above layers from the exposure unit and perform post-exposure treatment; and (o) (Not shown) Glue the indexing image sheet 102 to the clear substrate 150 (registering it properly with respect to the relief image).

Figure 2:
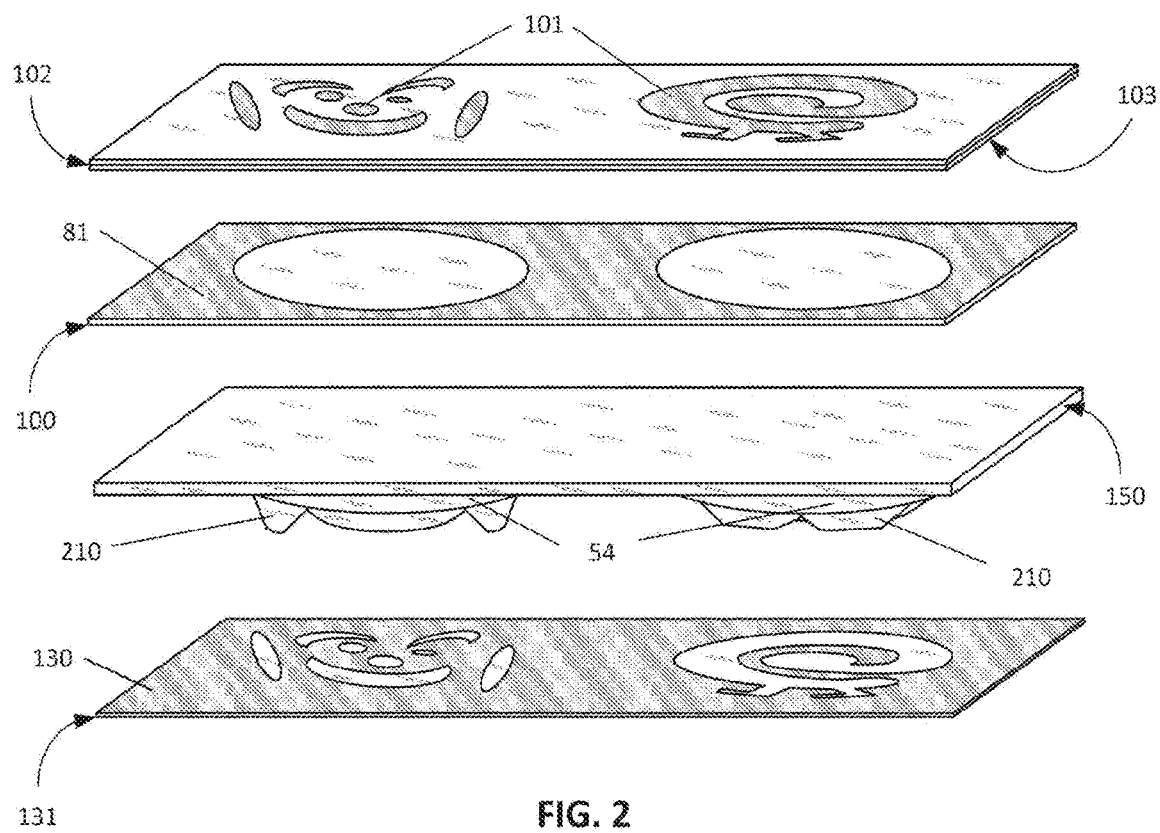
FIG. 2 is a perspective illustration of the separate layers produced in the prior art method of making a sheet of craft stamps.

FIG. 2 is a perspective illustration of the separated layers of a sheet of craft stamps produced after the exposure shown in FIG. 1 is fully cured and post-treated. The masking film 100 with its masking image 81, and the relief film 131, with its relief images 130, produce the stamp floor images 54 and the stamp relief images 210 during exposure to UV light. They are removed from the substrate 150 and the stamp relief images 210, respectively, and are discarded or reused. FIG. 2 also shows the clear indexing image sheet 102 that is typically thermally printed with the black index images 101 that are congruent to the ink image that will be printed by the stamp. This has an adhesive layer 103 applied to its underside so that it can be affixed to the clear top 104 of the stamp substrate 150. This is a labor-intensive step because the sticky image sheet 102 must be applied manually in exact registration with the stamp relief images 210 underneath.

Figure 3:
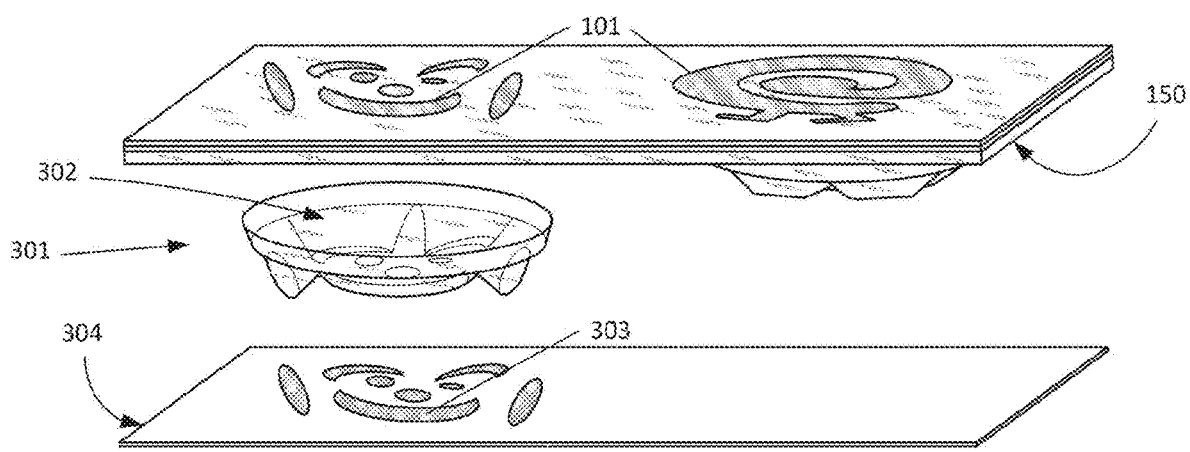
FIG. 3 is a perspective illustration of making a print using a stamp made according to the above method.

FIG. 3 is a perspective illustration of making an ink print 300 using a stamp 301 made according to the prior art method. The black indexing images 101 visible on top of the clear substrate 150 show the user what will be printed with a particular stamp. The stamp 301 which has a tacky upper surface 302 after the photopolymer is cured, has been peeled off of the substrate 150, temporarily applied to a clear plastic stamp tool (not shown), inked, and used to make an ink image 303 on a sheet of, e.g., paper 304.

Figure 4:
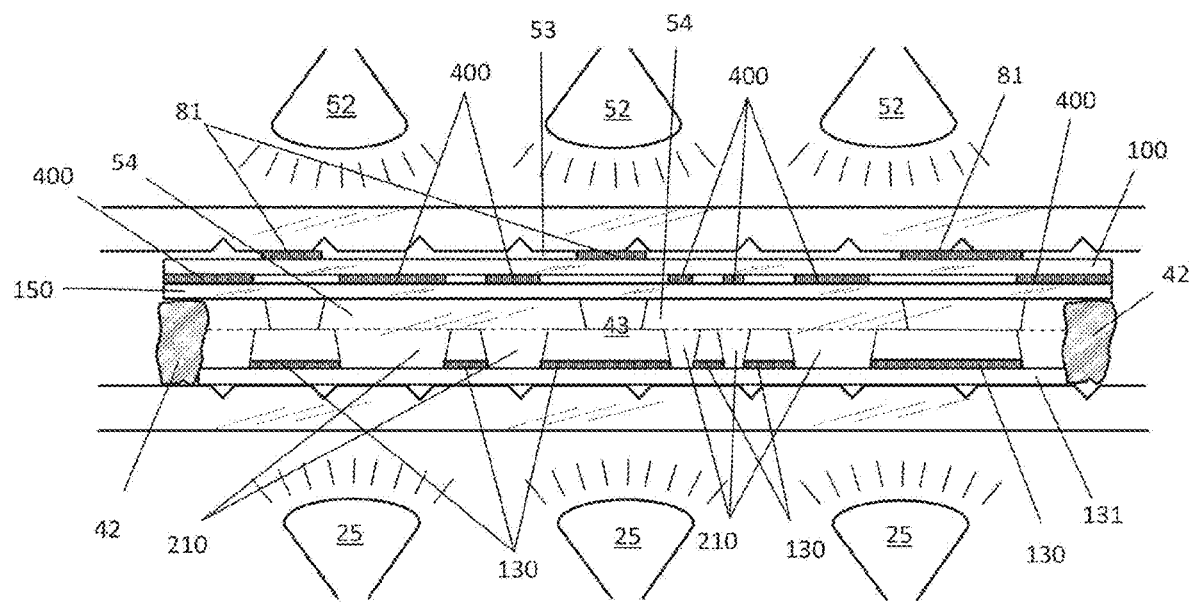
FIG. 4 is a cross-sectional illustration of the presently-invented method of making a craft stamp I-plate.

FIG. 4 is a cross-sectional illustration of the presently-invented method of making a craft stamp 1-plate. It is very similar to FIG. 1 except that indexing images 400 have been inkjet printed on the substrate 150 before the substrate 150 was placed on top of the photopolymer layer 43. Note that the indexing images 400 exactly match the shape of the bottoms of the polymeric stamp relief images 210. This is more fully described in the following FIG. 5. The steps in this process are:

(a) Print the masking images 81 on a masking film 100;
(b) Print the stamp relief images 130 on a relief image film 131;
(c) Print an indexing image 400 on a substrate 150;
(d) Place the relief image film 131 on the bottom glass 24 of the UV exposure unit;
(e) Optionally cover the relief image film 131 with a protective film (not shown);
(f) Pull a vacuum in lower vacuum grooves 34 to remove air from under image film 131;
(g) Cast a layer of liquid photopolymer 43 adjacent to the relief image film 131;
(h) Place the clear substrate 150 in contact with the upper surface of the liquid photopolymer layer 43;
(i) Place the printed masking film 100 on top of the clear substrate 150;
(j) Lower the lid on the UV exposure unit and optionally pull a vacuum in upper vacuum grooves 28 to remove air from between upper glass 28, masking film 100, and substrate 150;
(k) Shine polymerizing radiation 52 through the masking film 100 for an amount of time suitable to form polymerized floor images 54 of a desired thickness in the liquid photopolymer;
(l) Shine, polymerizing radiation 25 through the relief images 130 for an amount of time suitable to form polymerized relief images 210 in the liquid photopolymer between the polymerized floor images 54 and the relief images 130;
(m) Remove the above materials from the exposure unit;
(n) Remove the masking film 100 and the relief image film 131 from the materials: and
(o) Clean the polymerized material and substrate 150.

Figure 5:
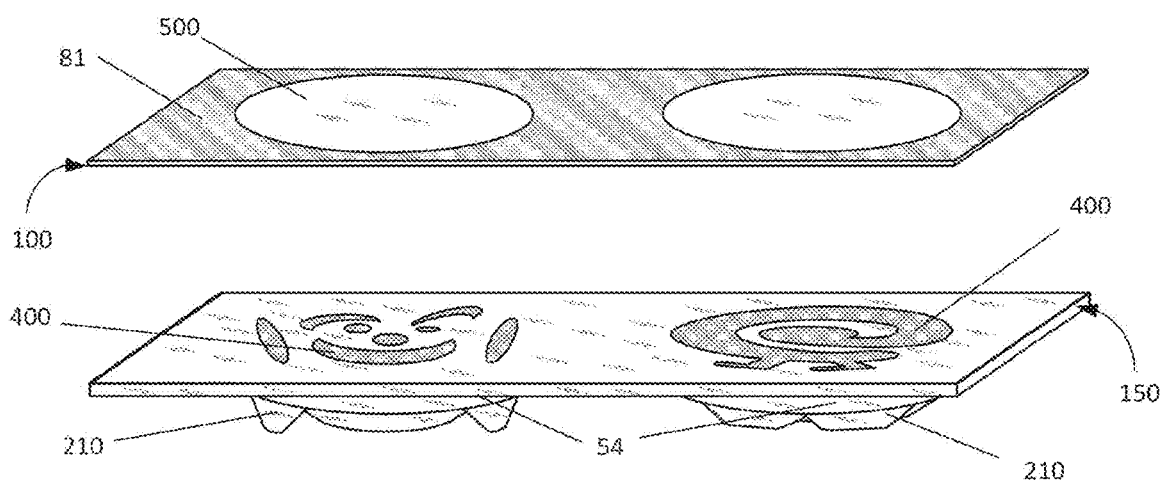
FIG. 5 is a perspective illustration of the separated layers of a sheet of craft stamps produced with the present invention.

FIG. 5 is a perspective illustration of the separated layers of a sheet of craft stamps produced after the exposure shown in FIG. 4 is fully cured and post-treated. This figure shows more clearly the 130 images of the present invention and the method of making them. As before, the masking film 100 with its masking image 81, and the relief film 131 with its relief images 130, produce the polymeric stamp floor images 54 and stamp relief images 210 during exposure to UV light. As before, they are removed from the substrate 150 and the stamp relief images 210, respectively, and are discarded or reused. However, in accordance with the present invention, indexing images 400 have now been printed on the upper surface 135 of the substrate 150. The inks used to produce the indexing images is solvent-based and may contain varying amounts of wavelength-specific light blockers and filters. In this invention the ink blocks light in the visible spectrum (390 to 700 nm wavelength) while being transparent or translucent to the shorter ultraviolet wavelengths. This allows UV light entering through the UV-transmitting areas 500 in the masking film 100 to create the same stamp floor images 210 unimpeded. The substrate 150 must be 140 compatible with the solvent ink formula, namely polyvinylethylene, polyethylene, polyvinyl chloride, certain other vinyl-based polymers or polyester, but any ink-compatible film may be used within the scope of this invention without limitation.

In this description of the invention, inkjet printers are mentioned because they have been used by the inventor to generate the desired high-definition images with solvent-based inks. However, any printer 145 capable of printing images of sufficient quality using solvent-based inks is within the scope of this invention without limitation.

What is claimed is:

1. A stamp comprising a cured photopolymer with a stamp image adjacent to the indexing image substrate comprising an actinic radiation-transmitting substrate, wherein the surface of the actinic radiation-transmitting substrate comprises an indexing image configured to resemble the stamp image, and wherein the indexing image is printed in an ink that is visible to a user and does not block ultra-violet radiation.

2. The stamp of claim 1, wherein the indexing image substrate comprises a vinyl-based polymeric material, a polyester, polyvinylethylene, polyethylene, or polyvinyl chloride.

3. The stamp of claim 1, wherein the indexing image substrate comprises a polyester.

4. The stamp of claim 1, wherein the ink blocks light in the visible spectrum.

5. A stamp produced by the method comprising:
printing an indexing image on a surface of an actinic radiation-transmitting substrate to produce an indexing image substrate, wherein the indexing image substrate has a top surface and a bottom surface, wherein the indexing image is configured to resemble the stamp image and wherein the indexing image is printed in an ink that is visible to a user and does not block ultra-violet radiation;

positioning a masking film above the top surface of the indexing image substrate, the masking film comprising a masking image printed on a portion of the masking film, the masking image being configured to block ultra-violet radiation;

positioning a relief film below a bottom surface of the indexing image substrate, the relief film comprising a relief image, wherein a liquid photopolymer layer is between the bottom surface of the indexing image substrate and the relief film; and shining polymerizing radiation through the masking film and relief film to form a stamp in the bottom surface of the indexing image substrate.

6. The stamp of claim 5, wherein the indexing image substrate comprises a vinyl-based polymeric material, a polyester, polyvinylethylene, polyethylene, or polyvinyl chloride.

7. The stamp of claim 5, wherein the indexing image substrate comprises a polyester.

8. The stamp of claim 5, wherein the ink blocks light in the visible spectrum.

9. The stamp of claim 5, wherein the masking image is not positioned directly above the indexing image.

10. The stamp of claim 5, wherein the indexing image does not block the polymerizing radiation that shines through the masking film.

11. A stamp with an indexing image printed on a surface of the stamp, wherein the stamp is produced by the method comprising:

printing an indexing image directly on a surface of an actinic radiation-transmitting substrate to produce an indexing image substrate, wherein the indexing image substrate has a top surface and a bottom surface, the indexing image being printed in an ink that does not transmit visible wavelengths of light and does not block polymerizing radiation;

positioning a relief film below a bottom surface of the indexing image substrate, the relief film comprising a relief image, wherein a photopolymer layer is between the bottom surface of the index image substrate and the relief film; and shining polymerizing radiation through the indexing image substrate and relief film.

12. The stamp of claim 11, wherein the indexing image substrate comprises a vinyl-based polymeric material, a polyester, polyvinylethylene, polyethylene, or polyvinyl chloride.

13. The stamp of claim 11, wherein the indexing image substrate comprises a polyester.

14. The stamp of claim 11, wherein the visible wavelengths of light are between about 390 nm and about 700 nm.

15. The stamp of claim 11, wherein the indexing image is printed onto the indexing image substrate using a printer.

16. A stamp produced by the method comprising:
printing a masking image on a masking film;
printing a stamp relief image on a relief film;
printing an indexing image on a surface of a substrate to produce an indexing image substrate, wherein the indexing image substrate has a top surface and a bottom surface;
positioning the relief film below the indexing image substrate;
casting a layer of liquid photopolymer on top of the relief film;
placing the bottom surface of the indexing image substrate in contact with the upper surface of the liquid photopolymer layer;
positioning the masking film above the substrate;
shining polymerizing radiation through the masking film to form a polymerized floor image in the liquid photopolymer;
shining polymerizing radiation through the relief film to form a polymerized relief image in the liquid photopolymer between the polymerized floor image and the relief film; and
removing the masking film and relief film.

17. The stamp of claim 16, further comprising covering the relief film with a protective film, wherein the protective film is positioned above the relief film prior to casting the photopolymer on the relief film.

18. The stamp of claim 16, wherein the indexing image is printed in an ink that transmits ultraviolet light and is visible light-opaque.

19. The stamp of claim 18, wherein the ink is solvent based.

20. The stamp of claim 16, wherein the indexing image is printed onto the surface of the substrate by a printer, wherein the printer is an ink-jet or thermal printer.

21. The stamp of claim 16, wherein the indexing image substrate comprises a vinyl-based polymeric material, a polyester, polyvinylethylene, polyethylene, or polyvinyl chloride.

22. The stamp of claim 16, wherein the indexing image substrate comprises a polyester.

23. The stamp of claim 16, wherein the indexing image does not block the polymerizing radiation that shines through the masking film.

24. The stamp of claim 16, wherein the masking image is not positioned directly above the indexing image.

25. The stamp of claim 16, wherein the indexing image substrate comprises an actinic radiation-transmitting substrate.

* * * * *